United States Patent
Dubois et al.

(10) Patent No.: US 6,418,922 B1
(45) Date of Patent: Jul. 16, 2002

(54) METHOD AND TOOLS FOR CUTTING SEMICONDUCTOR PRODUCTS

(75) Inventors: André Dubois; Jean-Pierre Levivier, both of Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/580,240

(22) Filed: May 26, 2000

(30) Foreign Application Priority Data

May 31, 1999 (FR) .............................................. 99 07022

(51) Int. Cl.[7] .............................. B28D 1/02; B26F 3/02
(52) U.S. Cl. ..................... 125/23.01; 125/12; 225/96.5; 225/97; 225/103; 225/104
(58) Field of Search ........................ 125/12, 20, 23.01, 125/40, 22; 451/28; 225/103, 104, 96.5, 97

(56) References Cited

U.S. PATENT DOCUMENTS

| 4,044,937 A | * | 8/1977 | Hill et al. ...................... 225/97 |
| 5,601,128 A | * | 2/1997 | Furphy ......................... 141/98 |
| 6,205,994 B1 | * | 3/2001 | Freund et al. ............... 225/103 |

* cited by examiner

*Primary Examiner*—M. Rachuba
(74) *Attorney, Agent, or Firm*—Wolf, Greenfield & Sacks, P.C.; James H. Morris

(57) ABSTRACT

A method of cutting a wafer of a semiconductor material, including breaking the wafer along cutting paths using a knife hitting a sheet supporting the wafer in a frame. The method includes using knives of different lengths according to the wafer region in which the cutting path is located using a tool block including apparatus for receiving at least two knives of different lengths and for rotating step-by-step around an axis to change the knife that is active in the wafer cutting.

19 Claims, 3 Drawing Sheets

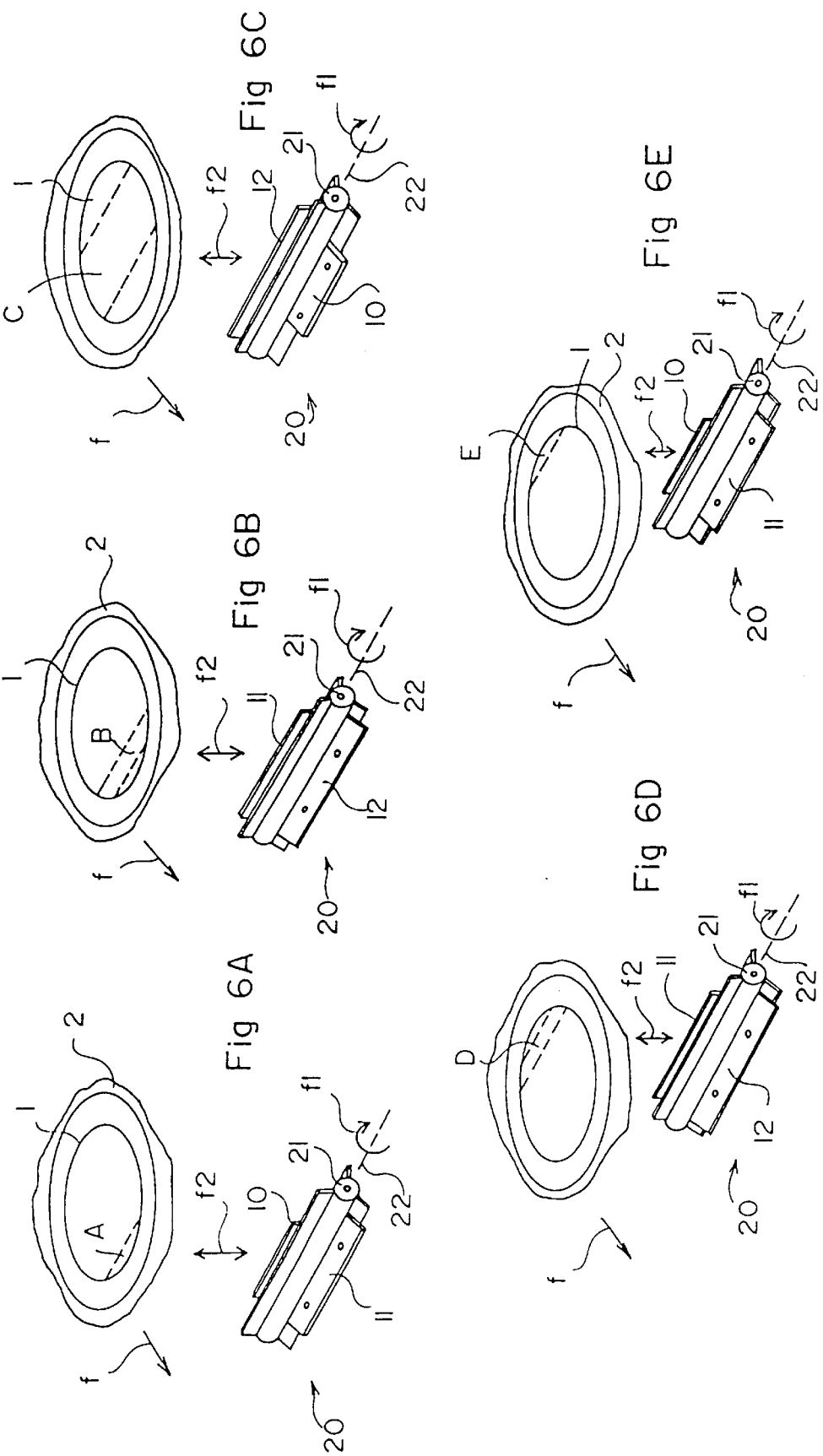

METHOD AND TOOLS FOR CUTTING SEMICONDUCTOR PRODUCTS

BACKGROUND OF THE INVENTION

1. Field of the Invention

The present invention relates to the manufacturing of semiconductor products and, more specifically, to the cutting of semiconductor wafers to individualize the components or circuits that have been formed thereon.

2. Discussion of the Related Art

FIG. 1 very schematically shows a wafer 1 made of a semiconductor material (for example, silicon) in a handling frame 2 used, in particular, to handle the wafer in the final steps of the manufacturing methods and, especially, after wafer 1 has been thinned, for example, by rectification of its rear surface. Frame 2 generally has the shape of a ring with an internal diameter slightly greater than the diameter of wafer 1. Wafer 1 is attached to frame 2 by means of a sheet 3, pasted by its periphery on frame 2 and the adhesive central portion of which is intended for receiving one of the surfaces of wafer 1. Generally, the surface of wafer 1 that is pasted on sheet 3 is the front surface (that which generally includes the contacts) to protect it during the steps of cutting and, if present, of rectification of the rear surface.

Once the wafer has been thinned, since it is very fragile, it is desirable to leave it in the same frame until the chips included therein are individualized.

The present invention more specifically relates to a cutting technology that consists of forming, generally, by sawing, a preliminary partial cutting from a first surface of the wafer, then to break the remaining thickness by means of a knife or blade that hits the other surface.

Thus, the present invention more specifically relates to the cutting of silicon wafers according to a method essentially including two steps, respectively of sawing and of breaking. This conventional method is illustrated in FIGS. 2A and 2B that are partial cross-section views of a wafer 1 in a cutting region.

According to this method, in a first step (FIG. 2A), preliminary cuttings 4 are formed between the chips to be separated. The preliminary cuttings are generally formed down to a depth ranging from one third to two thirds of the thickness of wafer 1.

Then, in a second step, the remaining silicon portion in the cutting regions is broken by means of a knife 5 that is vertically displaced (perpendicularly to the wafer plane) to hit adhesive sheet 3 right behind cutting blank 4. Fractures 6 are thus obtained along all cutting paths. The last step of the method consists of removing, from adhesive sheet 3, the individualized chips.

This cutting technique in two steps has many advantages, in particular, that of avoiding that the chips be notched on their rear surface.

However, such a cutting method raises implementation problems. One of these problems is the circular shape of the semiconductor wafers. Indeed, since the wafers are circular, the lengths of the cutting paths are different at the wafer periphery and towards its center. As a result, the length of knife 5 must be at least equal to the wafer diameter to enable breaking it in its central portion. The wafer is indeed first displaced (by the displacement of the frame) step by step (according to the interval between two parallel cutting paths) in a first horizontal direction (arrow f) to successively place the cutting paths perpendicular to this first direction in front of the knife that is moved vertically (arrow f2). Then, the wafer is turned by ninety degrees so that, with a same horizontal step by step motion (arrow f), the preliminary cuttings that are parallel to the first direction are broken, the chips being generally square-shaped.

FIG. 3 illustrates, in a simplified perspective view, the implementation of the conventional cutting method by means of a knife 5, the length of which is at least equal to the diameter of wafer 1.

Since wafer 1 is moved laterally (arrow f) to move on from cutting path to cutting path, it is necessary for the wafer support (frame 2') to have a sufficient diameter to enable the knife 5 to pass even at the edge of wafer 1. Accordingly, the diameter of frame 2' is much greater than the frame diameter (2, FIG. 1) that is required for the other steps of the process.

The use of a frame 2' of greater diameter has several disadvantages.

A first disadvantage is that it is necessary to use larger stands and different new machines to handle frames of greater diameter. This results in the need to perform significant investments.

Another disadvantage is that this causes an excess consumption of adhesive sheet 3, which is unjustified considering the wafer diameter.

For example, to process wafers having a diameter of approximately 15 centimeters (6 inches), a knife 5 having a length greater than 15 centimeters must be used. This requires the use of frames 2' corresponding, for example, to those otherwise used for wafers having a diameter of approximately 20 centimeters (8 inches).

SUMMARY OF THE INVENTION

The present invention aims at providing a novel cutting method and adapted tools that overcome at least the above-mentioned disadvantages.

The present invention more specifically aims at enabling the cutting of semiconductor wafers by a sawing and breaking method that requires no increase of the diameter of the frames supporting the wafers.

The present invention also aims at providing a solution that is compatible with current cutting equipment.

To achieve these and other objects, the present invention provides a method of cutting a wafer of a semiconductor material, including breaking the wafer along cutting paths by means of a knife applied by hitting a sheet supporting the wafer in a frame, by using knives of different lengths according to the wafer region in which the cutting path is located.

According to an embodiment of the present invention, the wafer is moved step by step above a tool block according to a direction perpendicular to the direction of the cutting paths, and the length of the different knives is adapted to the available free space inside the frame in the corresponding region.

According to an embodiment of the present invention, the wafer is first submitted to a cutting by partial sawing from the surface opposite to the supporting sheet, and the same frame is used for the sawing and the breaking.

The present invention also provides a tool block for cutting a semiconductor wafer by breaking this wafer along rectilinear cutting paths by means of a knife, including means for receiving at least two knives of different lengths and for being rotated step-by-step around an axis to change the knife that is active in the wafer cutting.

According to an embodiment of the present invention, the tool block includes three knives of different lengths around a cylindrical core, the knives being regularly distributed around the core by forming equal angles with one another.

According to an embodiment of the present invention, each knife is removably attached on a plate moving along with a core, adapted to be rotated around its axis.

The foregoing objects, features and advantages of the present invention will be discussed in detail in the following non-limiting description of specific embodiments in connection with the accompanying drawings.

BRIEF DESCRIPTION OF THE DRAWINGS

FIGS. 6A to 6E illustrate an embodiment of the method of the present invention by means of a cutting tool such as illustrated in FIG. 5.

DETAILED DESCRIPTION

Figure 1:
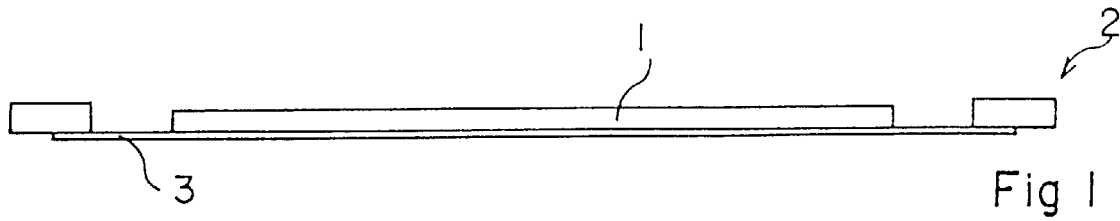
FIGS. 1, 2A, 2B, and 3, previously described, are meant to show the state of the art and the problem to solve.

The same elements have been designated with the same references in the different drawings. For clarity, the representations of the drawings are not to scale and only those elements that are necessary to the understanding of the present invention have been shown in the drawings and will be described hereafter. In particular, the structure of a cutting machine has not been shown, since the present invention adapts to a conventional machine.

To enable the cutting, by breaking by means of a knife a semiconductor wafer in a frame of reduced diameter, a first solution would be to use a knife having a length adapted to the smallest dimension. This knife of small length and/or the wafer would then be moved in both directions in the central portion of the wafer, to enable breaking the entire length of the cutting paths. This solution is not fully satisfactory for several reasons.

First, breaking the wafer by applying a knife of small size several times along a same cutting paths creates a high risk of breakage outside the cutting paths that are then not broken at one go.

Further, implementing such a solution would require a specific machine that, in particular, can move the frame containing the wafer and/or the knife in both horizontal directions. Now, conventional machines currently move the frame (and thus the wafer) always in the same horizontal direction, the cutting of the perpendicular paths of the wafer being performed by rotating by ninety degrees the frame supporting the wafer.

A feature of the present invention is to provide a blade change during the cutting of the same wafer. Accordingly, according to the present invention, a knife of small length is used when close to the wafer periphery. Then, a knife of greater length is used in an intermediary portion, to then use a knife of greatest (maximum) length in the vicinity of the wafer center.

The use of several knives of different lengths enables performing the cutting while the wafer is pasted on a sheet associated with a frame of reduced size.

Figure 2A:
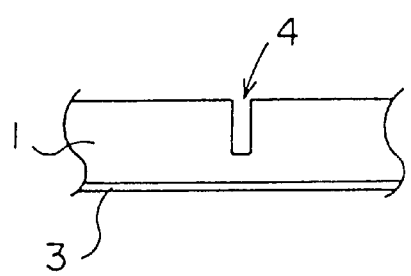
Figure 2B:
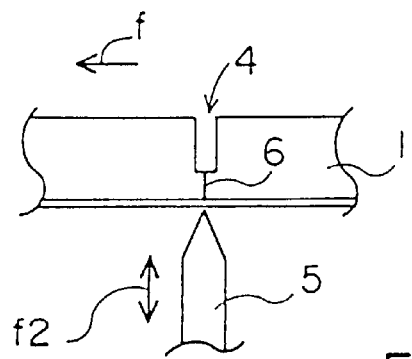
Figure 3:
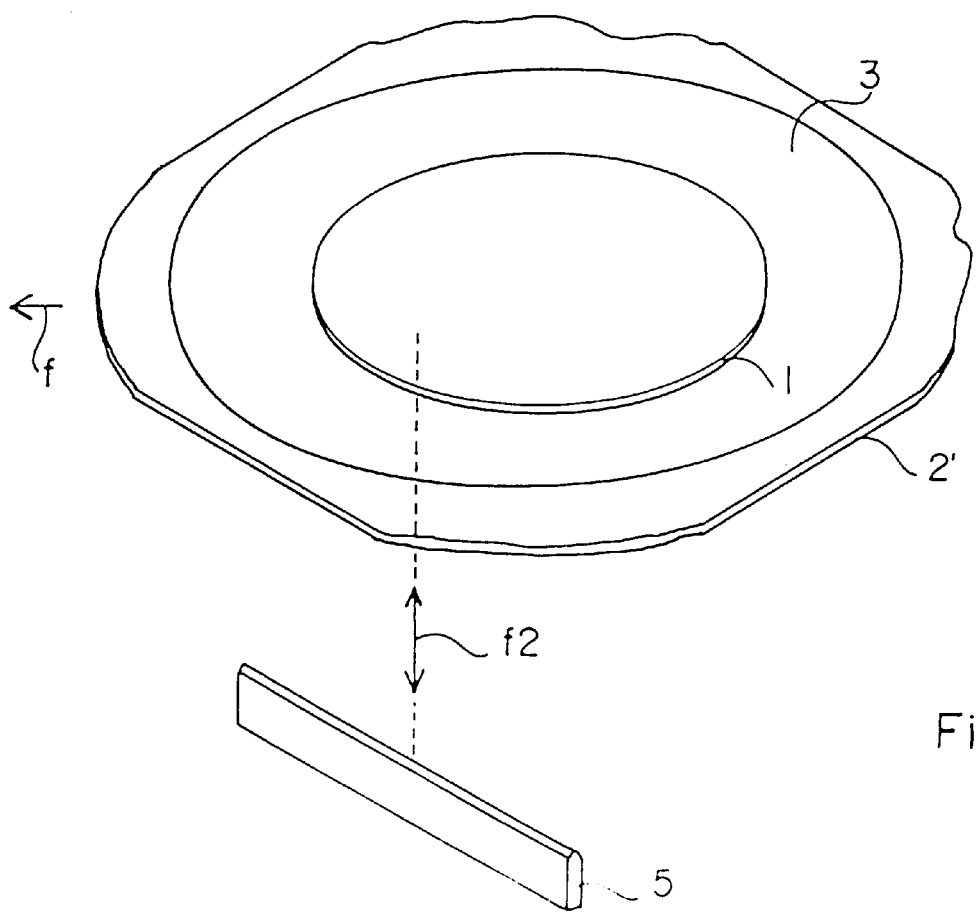
Figure 4:
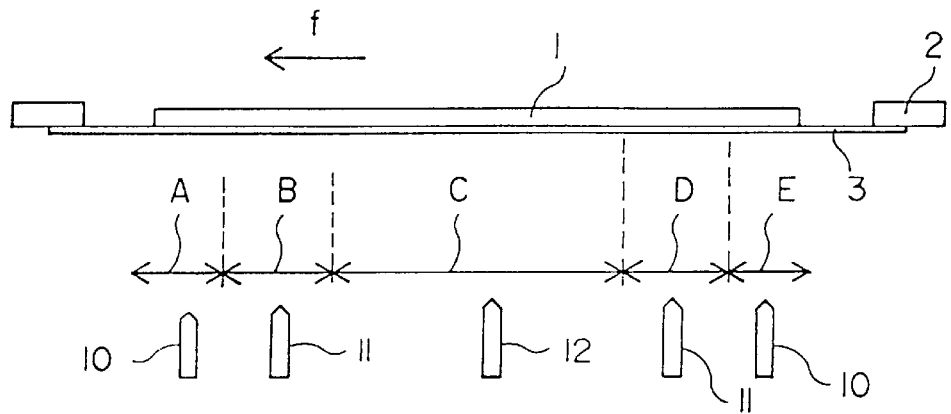
FIG. 4 very schematically shows, in cross-section, a semiconductor layer in a cutting frame illustrating an embodiment of the present invention.

FIG. 4 illustrates an embodiment of the method of the present invention. This drawing should be compared with the representation of FIG. 1. It schematically shows a wafer 1 to be cut, mounted on an adhesive sheet 3 supported by a frame 2. In FIG. 4, it is assumed that wafer 1 has already been submitted to the first step of cutting by sawing (FIG. 2A) and must now undergo the second step of breaking the cutting paths (not shown).

According to the embodiment illustrated in FIG. 4, three knives of different lengths are successively used along the step by step horizontal motion of the wafer before the cutting tool in a direction perpendicular to the direction of the cutting paths to be broken (arrow f). A first knife 10 of short length is used in a first peripheral area A of wafer 1. A second slightly longer knife 11 is used in a second area B of wafer 1. A third knife 12 is used in a third area C of the wafer including its central portion. Then, second knife 11 is used again in a fourth area D where the available length corresponds to that of area B. Finally, first knife 10 is used again in a fifth area E corresponding to the second edge of the wafer in the direction of arrow f.

An advantage of the present invention is that the wafer remains displaced above the knife in a single direction, which is compatible with the use of conventional machines.

A first solution to implement the method of the present invention includes of changing the knife of the tool block of a conventional machine as the wafer moves before the tool block in the wafer diameter. However, such a solution is not very convenient and increases the duration of the cutting process.

Figure 5:
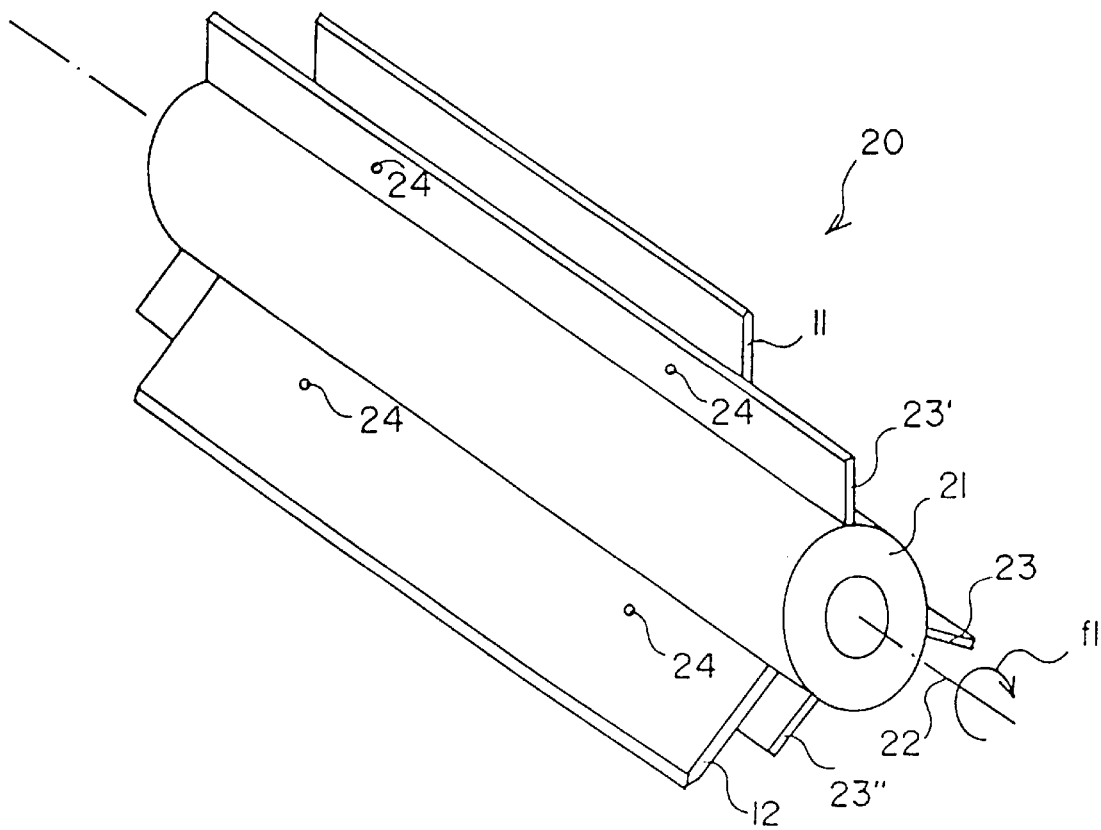
FIG. 5 shows in a perspective view an embodiment of a cutting tool according to the present invention.

Thus, according to a preferred embodiment of the present invention, a specific cutting tool that will be described hereafter in relation with FIG. 5 is used. FIG. 5 shows, in a perspective view, a tool block characteristic of the present invention adapted to implementing the above method.

A feature of this tool block 20 is that it bears several knives 10, 11, 12, around a cylindrical core 21 adapted to being rotated around its axis 22. The length of cylindrical core 21 corresponds at least to the length of longest knife 12.

In the embodiment illustrated in FIG. 5, three plates 23, 23', and 23" are provided to protrude from the external surface of cylinder 21 by being regularly distributed at an equal angle from one another. Each plate 23, 23', 23" represents, for example, a length corresponding to the length of cylindrical core 21 and is intended for receiving one of knives 10, 11, 12. For example, each knife is assembled on tool block 20 by being screwed or riveted 24 against one of plates 23, 23', 23".

To pass from one knife to the next knife during the linear progress of wafer 1 (arrow f, FIG. 4), tool block 20 is rotated by one third or two thirds of a turn, for example, in the direction of arrow f1.

An advantage of the present invention is that the use of a rotating tool block 20 such as illustrated by FIG. 5 optimizes the implementation of the cutting process. First, such a tool block is compatible with a linear step-by-step motion in a single direction by means of the cutting machine. Further, the rotating of the tool block around its axis 22 enables changing the knife involved in the cutting along the wafer progress before the tool block.

Adapting a conventional cutting machine to install the tool block of the present invention and its system of rotation around axis 22 is within the abilities of those skilled in the art. It should be noted that the rotating of the tool block will preferably be controlled by motorized means to enable its automation.

FIGS. 6A to 6E illustrate an embodiment of the present invention using a tool block 20 such as illustrated in FIG. 5, to cut a wafer 1 in a support 2 such as illustrated in FIG. 4.

FIG. 6A shows tool block 20 in a first position where the shortest blade 10 is used. This knife is used in a region A of the wafer corresponding to the edge thereof in the direction of arrow f.

FIG. 6B illustrates the position of tool block 20 in intermediary region B where knife 11 of intermediary length between knives 10 and 12 is used. Tool block 20 has thus been rotated by one third of a turn between FIGS. 6A and 6B in the direction of arrow f1.

FIG. 6C illustrates the position of tool block 20 after an additional rotation of one third of a turn with respect to FIG. 6B so that knife 12 is used in central region C of wafer 1.

FIGS. 6D and 6E illustrate the respective positions of cutting tool 20 in respective regions D and E of wafer 1 that correspond to the uses of knives 11 and 10. Between region C and region D, the tool block has been submitted either to a rotation by two thirds of a turn in the direction of arrow f1, or to a rotation by one third of a turn in the direction opposite to arrow f1. Between FIGS. 6D and 6E, the tool block has, similarly, been submitted either to a rotation by two thirds of a turn in the direction of arrow f1, or to a rotation by one third of a turn in the opposite direction.

In FIGS. 6A to 6E, the vertical motions of tool block 20 to reach the wafer have been symbolized by arrows f2.

Although the present invention has been described in relation with rectangular chips, it should be noted that it may also be implemented for the cutting of chips of different shapes (for example, octagonal), provided that the cutting paths are rectilinear.

Of course, the present invention is likely to have various alterations, modifications, and improvements which will readily occur to those skilled in the art. In particular, adapting a conventional cutting machine to install a tool provided by the present invention is within the abilities of those skilled in the art based on the functional indications given hereabove.

Further, it should be noted that although the use of three knives of different lengths is a preferred embodiment for the balance that it creates on tool block 20, a different number of knives may be used, provided that this number is greater than 1. Similarly, the sizing of the knives is within the abilities of those skilled in the art according to the diameter of the wafers to be processed and to the internal diameter of the supporting frames. As a specific example of embodiment, for wafers of a diameter of approximately 150 mm supported in frames having an inner diameter of approximately 195 mm, three knives 10, 11, and 12 having respective lengths of 100, 135 and 155 mm may be used.

Further, the means of assembling the knives on rotating tool block 20 described as an example may be replaced with analogous means, provided that they keep a knife change by rotating the tool block. Finally, it should be noted that although the displacement of the wafer above the knife is a usual embodiment, the tool block may also be displaced in a plane parallel to the wafer plane.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A tool block for cutting a semiconductor wafer comprising:
   a plurality of knives attached to a surface of the tool block, wherein axes of the plurality of knives are parallel to an axis of the tool block.

2. The tool block of claim 1, wherein the tool block is cylindrical and each of the knives in the plurality of knives is arranged in a radial fashion with respect to the tool block.

3. A method of breaking a wafer held in a frame having a first region and a second region, comprising:
   using a first tool having a first length to break the wafer in the first region; and
   using a second tool having a second length to break the wafer in the second region,
   wherein the first length and the second length are different, the first length is such that the first tool fits in the frame in the first region and the second length is such that the second tool fits in the frame in the second region.

4. The method according to claim 3 wherein the first tool is a knife.

5. The method of claim 3 further comprising an act of moving the wafer relative to the tool in a direction perpendicular to at least one cutting path to align the wafer with the tool.

6. The method of claim 5 further comprising an act of rotating the wafer relative to the tool to expose cutting paths of other angles.

7. A method of breaking a wafer having a first region and a second region, comprising:
   using a first tool having a first length to break the wafer in the first region; and
   using a second tool having a second length to break the wafer in the second region,
   wherein the first length and the second length are different, the first length is at least equal to a first region length of the first region and the second length is at least equal to a second region length of the second region.

8. The method according to claim 7 wherein the first tool is a knife.

9. The method of claim 7 further comprising an act of moving the wafer relative to the tool in a direction perpendicular to at least one cutting path to align the wafer with the tool.

10. The method of claim 7 further comprising an act of rotating the wafer relative to the tool to expose cutting paths of other angles.

11. A tool block for cutting a semiconductor wafer comprising:
    a plurality of knives attached to a surface of the tool block in a radial orientation,
    wherein axes of the plurality of knives are parallel to an axis of the tool block.

12. A method of cutting a wafer of a semiconductor material, including breaking the wafer along cutting paths by means of a knife for hitting a sheet supporting the wafer in a frame, wherein knives of different lengths are used according to a wafer region in which the cutting path is located.

13. The method of claim 12, wherein the wafer is moved step by step above a tool block according to a direction perpendicular to a direction of the cutting paths, and the length of the different knives is adapted to a size of the frame in the corresponding region.

14. The method of claim 12, in which the wafer is first submitted to a cutting by partial sawing from a surface opposite to the supporting sheet, wherein the same frame is used for the sawing and the breaking.

15. The method of claim 13, in which the wafer is first submitted to a cutting by partial sawing from a surface opposite to the supporting sheet, wherein the same frame is used for the sawing and the breaking.

16. A tool block for cutting a semiconductor wafer by breaking the wafer along rectilinear cutting paths by means of a knife, including means for receiving at least two knives of different lengths and for rotating step-by-step around an axis to change the knife that is active in the wafer cutting.

17. The tool block of claim 16, including three knives of different lengths around a cylindrical core, the knives being regularly distributed around the core by forming equal angles with one another.

18. The tool block of claim 16, wherein each knife is removably attached on a plate moving along with a core, wherein the core is adapted to be rotated around an axis.

19. The tool block of claim 16, wherein each knife is removably attached on a plate moving along with a core, wherein the core is adapted to be rotated around an axis.

* * * * *

UNITED STATES PATENT AND TRADEMARK OFFICE
CERTIFICATE OF CORRECTION

PATENT NO. : 6,418,922 B1
DATED : July 16, 2002
INVENTOR(S) : André Dubois and Jean-Pierre Levivier It is certified that error appears in the above-identified patent and that said Letters Patent is hereby corrected as shown below:

<u>Title page,</u>
Item [56], References Cited, should list the following:

--                  U.S. PATENT DOCUMENTS 4,787,951          11/29/88          Okamato          225/97

OTHER PUBLICATIONS

French Search Report from French Patent Application 99/07022, filed May 31, 1999

Patent Abstracts of Japan, vol. 017, no. 356 (E-1394), July 6, 1993 & JP-A-05 055373 (Rohm Co. Ltd.)

Patent Abstracts of Japan, vol. 012, no. 348 (E-659), September 19, 1988 & JP-A-63 104442 (Mitsubishi Electric Corp.)

Patent Abstracts of Japan, vol. 014, no. 399 (M-1017), August 29, 1990 & JP-A-02 151405 (Disco Abrasive System Ltd.) --

Signed and Sealed this

Nineteenth Day of November, 2002

*Attest:*

*Attesting Officer*

JAMES E. ROGAN
*Director of the United States Patent and Trademark Office*